(12) United States Patent
Therrien et al.

(10) Patent No.: US 8,664,939 B2
(45) Date of Patent: Mar. 4, 2014

(54) UTILITY METER COVER WITH INTERLOCKING BIDIRECTIONAL TAB

(75) Inventors: Wayne Alfred Therrien, Rochester, NH (US); Douglas Scott Crow, Seabrook, NH (US)

(73) Assignee: General Electric Company, Schenectady, NY (US)

(*) Notice: Subject to any disclaimer, the term of this patent is extended or adjusted under 35 U.S.C. 154(b) by 281 days.

(21) Appl. No.: 13/230,409

(22) Filed: Sep. 12, 2011

(65) Prior Publication Data

US 2013/0063872 A1    Mar. 14, 2013

(51) Int. Cl.
  *G01R 1/04* (2006.01)
  *G01R 1/00* (2006.01)
  *G01R 11/32* (2006.01)

(52) U.S. Cl.
  USPC ............................ 324/156; 324/110; 324/142

(58) Field of Classification Search
  None
  See application file for complete search history.

(56) References Cited

U.S. PATENT DOCUMENTS

| | | |
|---|---|---|
| 2,914,354 A | 11/1959 | Moberg |
| 3,628,096 A | 12/1971 | Drew, Jr. et al. |
| 3,636,498 A | 1/1972 | McQuarrie |
| 3,928,788 A | 12/1975 | Finnen et al. |
| 3,943,441 A | 3/1976 | Shackford |
| 4,416,478 A | 11/1983 | Canney |
| 4,477,861 A | 10/1984 | Byrd, Jr. et al. |
| 4,699,408 A | 10/1987 | Kesselman |
| 4,713,609 A | 12/1987 | Losapio et al. |
| 4,733,893 A | 3/1988 | Davis et al. |
| 5,404,266 A | 4/1995 | Orchard et al. |
| 5,418,683 A | 5/1995 | Orchard et al. |
| 5,473,504 A | 12/1995 | Horan et al. |
| 5,514,959 A | 5/1996 | Horan et al. |
| 5,774,324 A * | 6/1998 | Hayashi et al. ............... 361/225 |
| 5,788,294 A | 8/1998 | Leon et al. |
| 5,861,742 A | 1/1999 | Miller et al. |
| 6,000,034 A | 12/1999 | Lightbody et al. |
| 6,082,789 A | 7/2000 | Wenk |
| 6,316,932 B1 | 11/2001 | Horan et al. |
| 6,406,074 B1 | 6/2002 | Mahaney |
| 6,677,742 B1 | 1/2004 | Voisine et al. |
| 7,106,044 B1 | 9/2006 | Lee et al. |
| 7,182,632 B1 | 2/2007 | Johnson, Jr. et al. |
| 7,821,776 B2 | 10/2010 | Loy et al. |

(Continued)

FOREIGN PATENT DOCUMENTS

DE        102006050700 A1      5/2007

OTHER PUBLICATIONS

Pape: U.S. Appl. No. 12/048,927, Office Action Jul. 2, 2012, 19 pgs.
Search Report issued in connection with EP Application No. 12158926.1, Jun. 13, 2012.

*Primary Examiner* — Vinh Nguyen
(74) *Attorney, Agent, or Firm* — Hoffman Warnick LLC; William Heinze

(57) ABSTRACT

A utility meter cover and complementary base are disclosed, the cover including a window section and a shroud. The shroud is for covering a complementary portion of a meter base, and includes: a radially extending base portion; an axial extension extending from the base portion, the axial extension for obstructing access to the complementary portion of the meter base; and a key member extending axially from the base portion, the key member having a bidirectional tab for engaging a slot in the complementary portion of the meter base.

15 Claims, 4 Drawing Sheets

(56) References Cited

U.S. PATENT DOCUMENTS

| | | |
|---|---|---|
| 2004/0150384 A1 | 8/2004 | Holle et al. |
| 2005/0122094 A1 | 6/2005 | Robinson |
| 2009/0244818 A1 | 10/2009 | Loy et al. |
| 2010/0000270 A1 | 1/2010 | DeWalch et al. |
| 2010/0295255 A1 | 11/2010 | DeWalch et al. |

* cited by examiner

UTILITY METER COVER WITH INTERLOCKING BIDIRECTIONAL TAB

BACKGROUND OF THE INVENTION

The subject matter disclosed herein relates generally to utility meter technology, and more particularly, to an assembly for a utility meter including an interlocking utility meter cover.

Current designs of utility meter assemblies include a main housing, or base, that houses the electronic and electromechanical components that comprise a utility meter, and a cover that is placed over the utility meter and base. Traditionally, the primary function of the cover is to provide a safe and weather-tight environment for meter use in an exterior application (e.g., external to a building, home, etc.). In the recent years, however, the cover has been designed not only for the safety and environmental isolation of the meter's components, but also against unauthorized access to the internal workings of the metering device, particularly access that may result in a permanent or temporary alteration of the inner workings of the device.

Conventional cover designs include a cover-to-base interface utilizing a set of complementary "J-shaped" or "L-shaped" tabs or notches, which are typically located at the outer periphery of the meter base and cover. During installation, the tabs on the cover are aligned over gaps between the tabs along the base. The cover is then rotated such that the J-shaped or L-shaped tabs of the cover and base, respectively, align. Then, a rotational limiting member (e.g., a pin, wire or other mechanism) is inserted through a portion of the base and cover, which prevents the tabs from substantially misaligning. While these tabs allow the cover to be initially radially linked with the base, the pliability of the materials used in the cover and/or base allow for tampering (e.g., removal via axial separation). That is, these conventional interfaces are still susceptible to tampering, where the cover can be removed and subsequently replaced without displaying signs of damage. This allows an interested party to tamper with the inner workings of the meter device essentially undetected.

BRIEF DESCRIPTION OF THE INVENTION

A utility meter cover and complementary base are disclosed, the cover including a window section and a shroud. The shroud is for covering a complementary portion of a meter base, and includes: a radially extending base portion; an axial extension extending from the base portion, the axial extension for obstructing access to the complementary portion of the meter base; and a key member extending axially from the base portion, the key member having a bidirectional tab for engaging a slot in the complementary portion of the meter base.

A first aspect of the invention includes a utility meter cover comprising: a window section; and a shroud for covering a complementary portion of a meter base, the shroud including: a radially extending base portion; an axial extension extending from the base portion, the axial extension for obstructing access to the complementary portion of the meter base; and a key member extending axially from the base portion, the key member having a bidirectional tab for engaging a slot in the complementary portion of the meter base.

A second aspect of the invention includes a utility meter base having: a platform for mounting a plurality of meter components; and a rim substantially surrounding the platform, the rim including: a base portion; a slot located within the base portion; and a pair of opposing hooks axially extending from the base portion and overlying the slot, the pair of opposing hooks for engaging a complementary portion of a utility meter cover fitting within the slot.

A third aspect of the invention includes a utility meter having: a base section including: a platform for mounting a plurality of meter components; and a rim substantially surrounding the platform; and a cover coupled to the base section, the cover including: a window section; and a shroud extending from the window section, the shroud including: a radially extending base portion overlying a first face of the rim; and an axial extension extending from the base portion and overlying a second face of the rim, wherein either the rim or the base member includes a key member extending axially therefrom, the key member having a bidirectional tab for engaging a slot in a complementary portion of the other of the rim or the base member.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

Figure 1:
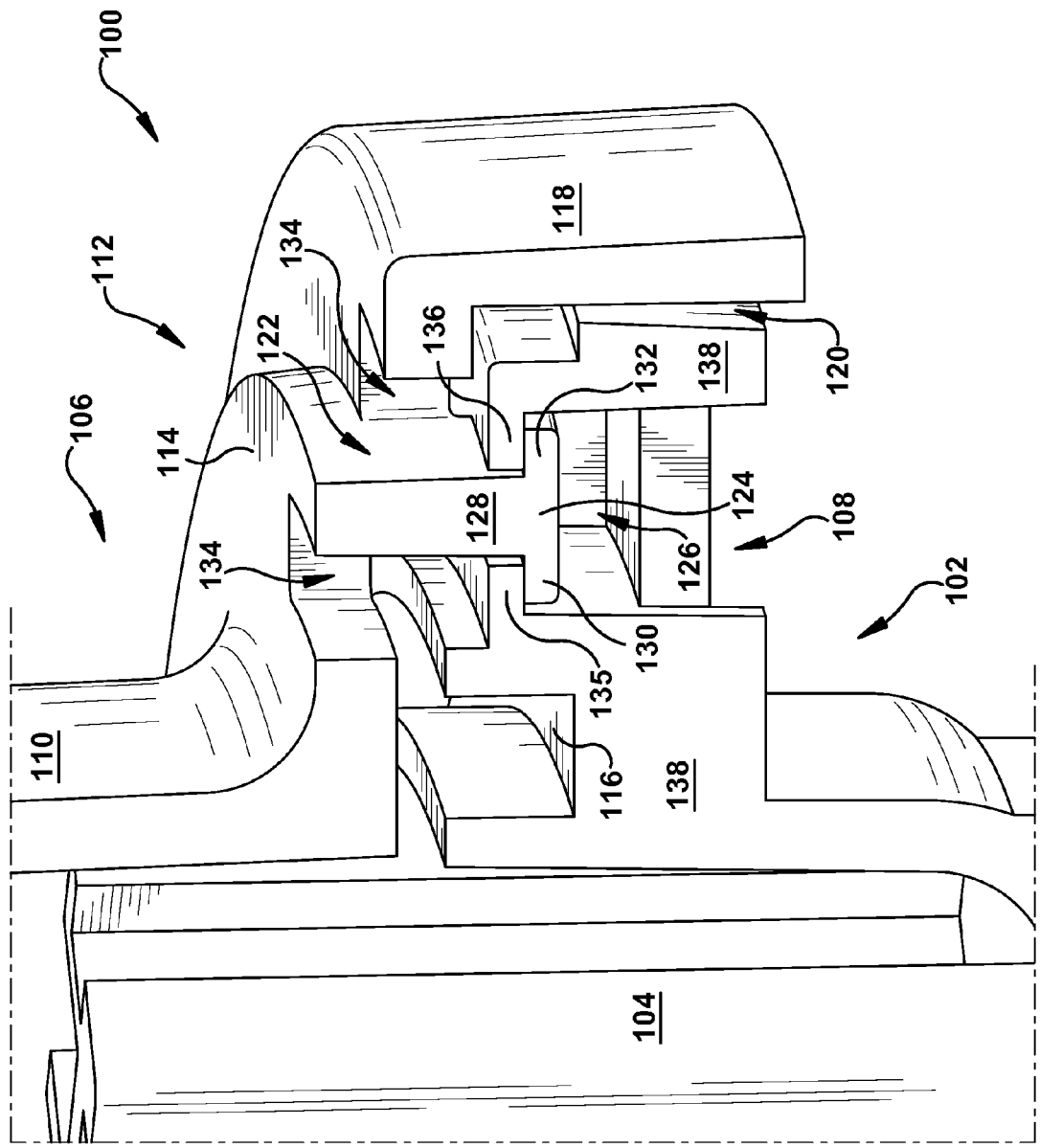
FIG. 1 shows a three-dimensional cut-away view of a portion of a utility meter according to embodiments of the invention.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION OF THE INVENTION

The subject matter disclosed herein relates generally to meter technology, and more particularly, to an assembly for a utility meter including an interlocking utility meter cover.

As noted herein, current designs of utility meter assemblies include a main housing or base, that houses the electronic and electromechanical components that comprise a utility meter, and a cover that is placed over the utility meter and base. Conventional cover designs include a cover-to-base interface utilizing a set of complementary "J-shaped" or "L-shaped" tabs or notches. During installation, the tabs on the cover are aligned over gaps between tabs along the base. The cover is then rotated such that the J-shaped or L-shaped tabs of the cover and base, respectively, align. Then a rotational limiting member (e.g., a pin, wire or other mechanism) is inserted through a portion of the base and cover, which prevents the tabs from substantially misaligning.

While these L-shaped or J-shaped tabs allow the cover to be initially radially linked with the base, the pliability of the materials used in the cover and/or base allow for tampering (e.g., removal via axial separation). That is, these conventional interfaces are still susceptible to tampering, where the cover can be removed and subsequently replaced without displaying signs of damage. This allows an interested party to tamper with the inner workings of the meter device essentially undetected.

The design of the base-cover interface is limited by a number of industry standards, which dictate the types and quantity of materials that can be used to secure the interface. These industry standards have driven the conventional base-cover interface to include substantially pliable plastics. These pliable plastics allow an interested party to insert a member (e.g., a flat-head screwdriver) at the base-cover interface and pry the cover from the base, without causing critical material fatigue (e.g., severe cracking, breaking, etc.) in either the base or the cover. This allows the interested party to remove the cover, and subsequently replace that cover, undetected.

In contrast to conventional approaches, aspects of the invention use a complementary "T-shaped" key-and-slot interface to prevent intrusion into a utility meter. The meter cover-base interface shown and described herein is resistant to at least some of the intrusion techniques which are successful in conventional meter interfaces.

In one embodiment, a utility meter cover and a complementary base are disclosed, where the cover includes a window section and a shroud. The shroud is for covering a complementary portion of a meter base, and includes: a radially extending base portion; an axial extension extending from the base portion, the axial extension for obstructing access to the complementary portion of the meter base; and a key member extending axially from the base portion, the key member having a bidirectional tab for engaging a slot in the complementary portion of the base member.

As will be understood from the descriptions provided herein, the bidirectional tab is configured to engage with a slot in a base member. In some embodiments, the slot can be formed from two substantially opposing hooks. These hooks can receive a base portion of the key member, and the hooks can engage the bidirectional tab, thereby restricting axial movement of the base member with respect to the cover. This can help to prevent undesirable tampering with the utility meter, as the base member and cover must be physically damaged (e.g., via cracking, heating or other material alteration) to remove the cover from the base in the axial direction.

Turning to FIG. 1, an three-dimensional cut-away view of a portion of an interlocking meter cover assembly 100 is shown according to embodiments of the invention. The meter cover assembly 100 can includes a base section 102 having a platform 104, where the platform 104 is adapted for mounting of the utility meter's working components (e.g., electrical and electro-mechanical components). The utility meter may include an electrical meter, a water meter, a gas meter, or any other form of conventional utility meter known in the art (not shown). The meter cover assembly 100 further includes a cover 106 configured to bi-directionally couple with the base 102, as will be described further herein.

As shown, the base section 102 can also include a rim 108 substantially surrounding the platform 104. The cover 106 includes a window section 110, where the components of the meter (not shown) can be viewed (e.g., by a technician or other human viewer). The cover 106 also includes a shroud 112 extending from the window section 110, where the shroud 112 is configured to engage with the rim 108 to interlock the base section 102 and the cover 106 as is described further herein. As shown, the shroud 112 can extend substantially radially outward from the central, or primary axis (A) of the platform 104 (and consequently, the meter assembly 100). The shroud 112 can include a radially extending base portion 114, extending from the window section 110, which is designed to overly a first face 116 of the rim 108. The shroud 112 can further include an axial extension 118 extending axially from the base portion 114, and overlying a second face 120 of the rim 108. The axial extension 118 can extend approximately ¼ to ⅜ of an inch in some cases. It is understood that this axial extension 118 can be omitted in some embodiments, as the bi-directional coupling mechanisms described herein may eliminate the need for such an extension 118 in preventing tampering with the interlocking meter cover assembly 100.

As shown, the cover 106 can further include a key member 122 extending axially from the base portion 114, between the window section 110 and the axial extension 118. The key member 122 includes a bi-directional tab 124 for engaging a slot 126 in the rim 108. The bi-directional tab 124 can include an axially extending base section 128, a first hook 130 extending radially inward from the base section 128, and a second hook 132 extending radially outward from the base section 128. As noted herein, the bi-directional tab 124 can engage the rim 108 (and consequently, the base 102) both radially inwardly and radially outwardly, which can reduce the ability of an interested party to tamper with the interface between the base 102 and cover 106 (e.g., via separation). This prevention is aided in some aspects by the inverted substantially "T-shaped" key member 122, where the base section 128 and hooks 130, 132 combine to form a substantially T-shaped segment. It is understood that the hooks 130,132 are not necessarily perpendicular to base section 128, and that the term "substantially T-shaped" can include a range of angles between the hooks 130, 132 and the base section 128. In some embodiments, the hooks 130, 132 can be respectively aligned at approximately 15-165 degrees with respect to the base section 128. In some cases, the interface between base section 128 and the hooks 130, 132 can resemble a "roof-top" like configuration (e.g., having an angle less than 90 degrees with respect to one another). In these cases, the angles between the base section 128 and hooks 130, 132 can provide for a self-aligning feature when the key member 122 interacts with the rim 108. This self-aligning feature utilizes the flexibility of the material forming the key member 122, such that when the key member 122 is engaged with the rim 108 (at opposing hooks 135, 136) and an axially separating force is applied to the base 102 and cover 106 (as if to separate the two), the hooks 130, 132 will remain at an angle of approximately 75-105 degrees with respect to the base section 128. In some cases, as shown in FIG. 1, that angle can be approximately 90 degrees. It is additionally understood that the interface between the base section 128 and the hooks 130, 132 can be at least partially rounded or angular, providing for greater material strength at the interface when a force, e.g., a separation force, is applied. Also shown in the cover 106, the shroud 112 can also include a pair (or more) of optional openings 134 radially disposed about the key member 122. As noted herein, these openings 134 are optional, and may aid in the manufacture of the hooks 130, 132.

As shown, the rim 108 includes hooks 135, 136 (or, opposing hooks or base hooks) that can engage with the hooks 130, 132 of the key member 122 to limit movement of the cover 106 relative to the base 102. The rim 108 can further include a base portion 138 housing the slot 126, where the slot 126 is defined by the base hooks 135, 136. The slot 126 can be sized to fit the complementary key member 122, and in particular, the slot 126 can be sized to house the bi-directional tab 124. As will be further described herein, the slot 126 can extend substantially circumferentially about the axial center (or axis, A) of the platform 104. As is further described herein, a plurality of slots (similar to slots 126) can be positioned along the rim 108 of the base member 102, where in some cases, the plurality of slots includes six slots separated by approximately 60 degrees from one another along the rim 108.

As shown, the hooks 135, 136 can be paired such that a first hook 135 extends radially outward from the axial center (or axis, A) of the platform 104, and a second hook 136 extends radially inward toward the axial center (or axis, A) of the platform 104. As shown, the radially inwardly extending hook 136 is located radially outward of the radially outwardly extending hook 135.

Figure 2:
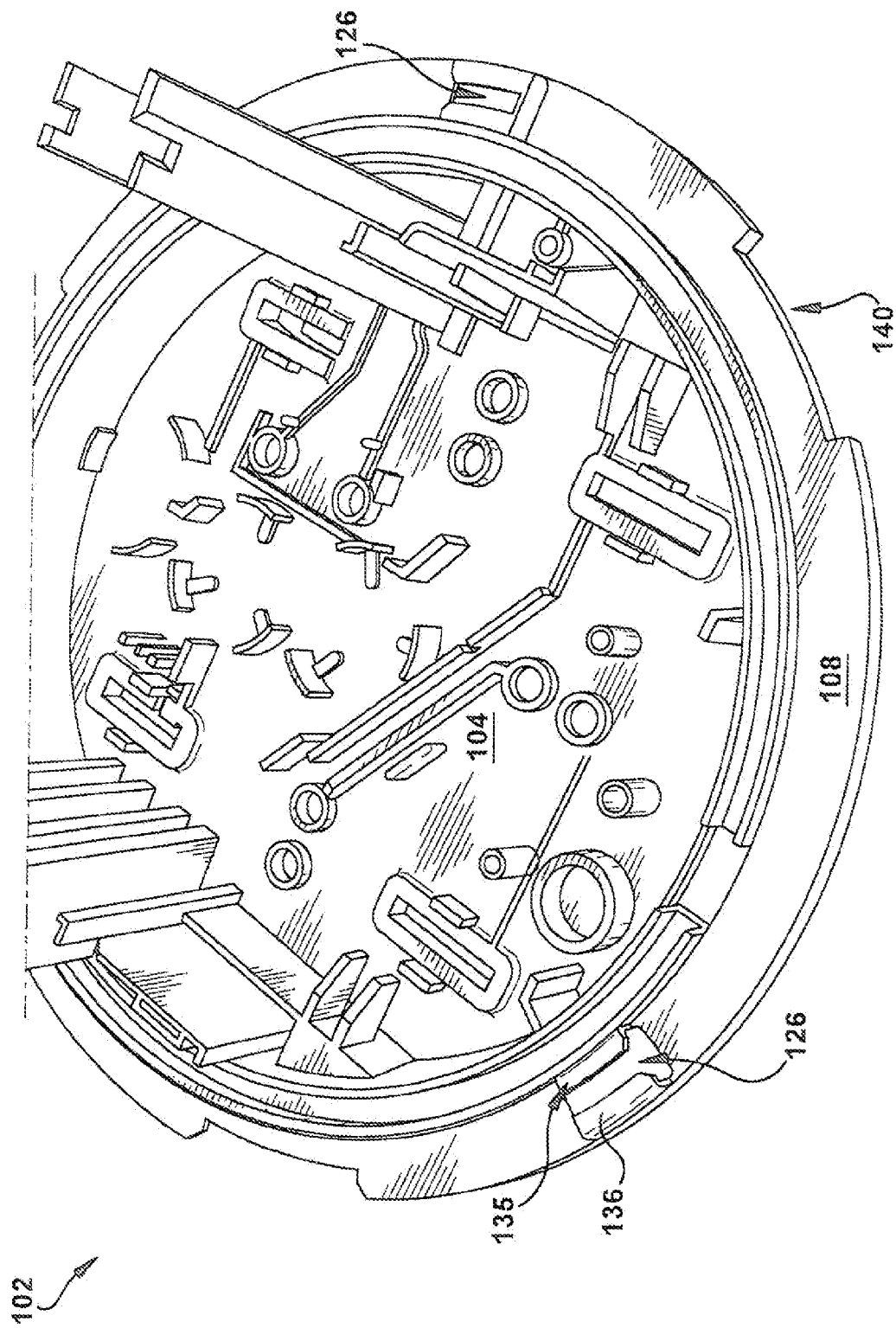
FIG. 2 shows a three-dimensional perspective view of a base section of a utility meter according to embodiments of the invention.

FIG. 2 shows a three-dimensional perspective view of the base section 102, further illustrating the relationship between the slots 126 in the rim 108, and the pair of hooks 136 designed to receive the bi-directional tab 124 of the cover 106. As shown, the base section 102 includes a conventional gap 140 which can be used to form the traditional L-shaped or J-shaped tabs, along with the bi-directional tabs 124 shown and described with reference to embodiments of the invention. It is understood that some embodiments of the invention can allow for a hybrid configuration using both bi-directional tab linking and L-shaped or J-shaped tabs. However, in other embodiments of the invention, the L-shaped or J-shaped tabs (and corresponding gaps 14) are omitted, and a set of bi-directional tabs (e.g., six at 60-degree separations) are located along the outer portion of the rim 108.

Figure 3:
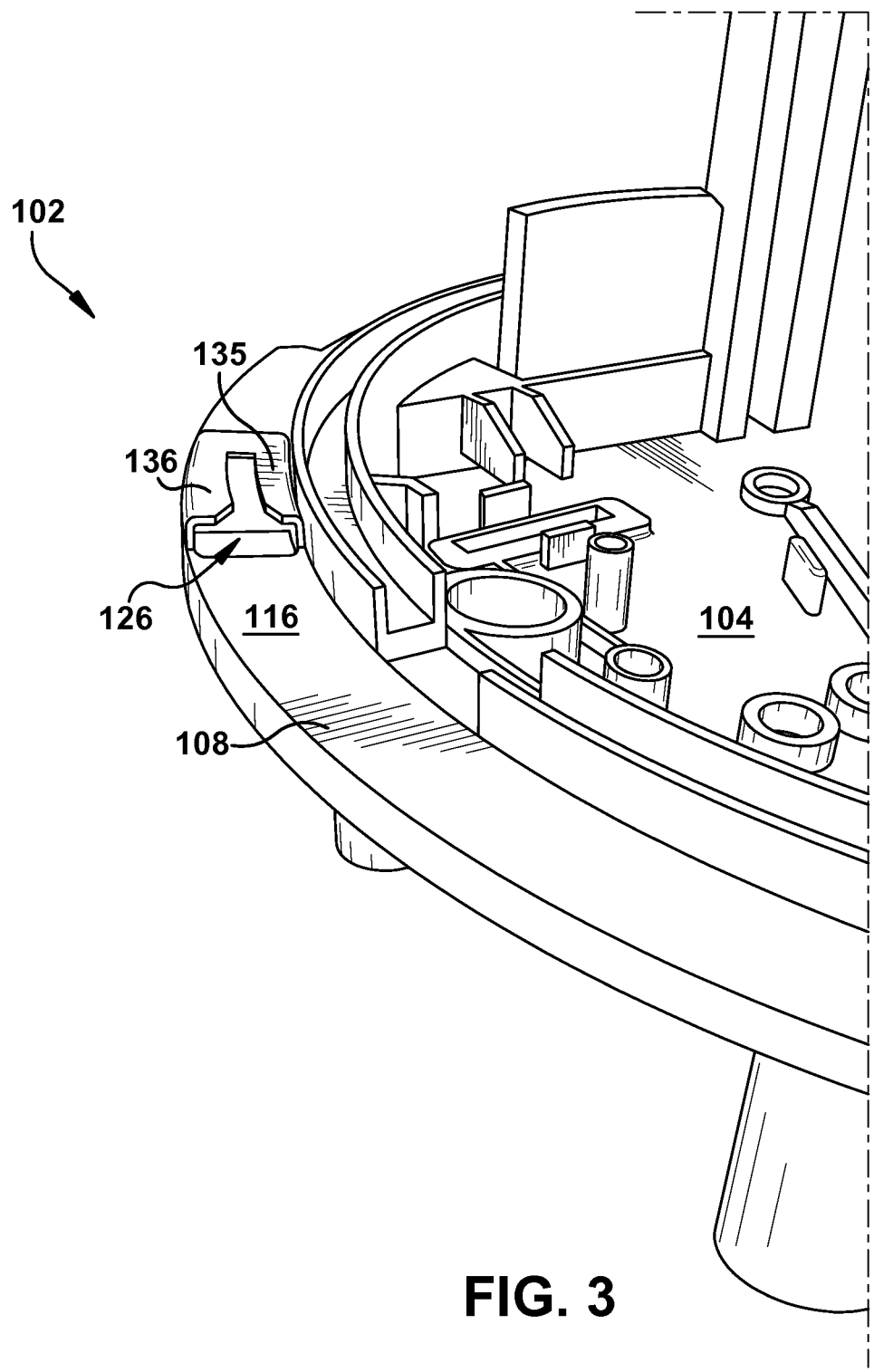
FIG. 3 shows a close-up three-dimensional perspective view of the base section of FIG. 2 according to embodiments of the invention.

FIG. 3 shows a close-up three-dimensional perspective view of a portion of the base section 102 from FIG. 2. As shown, the pair of hooks 136 extend axially above the upper surface 116 of the rim 108, allowing the pair of hooks 136 to engage with the bi-directional tab 124 of the cover 106 (both not shown in this depiction).

Figure 4:
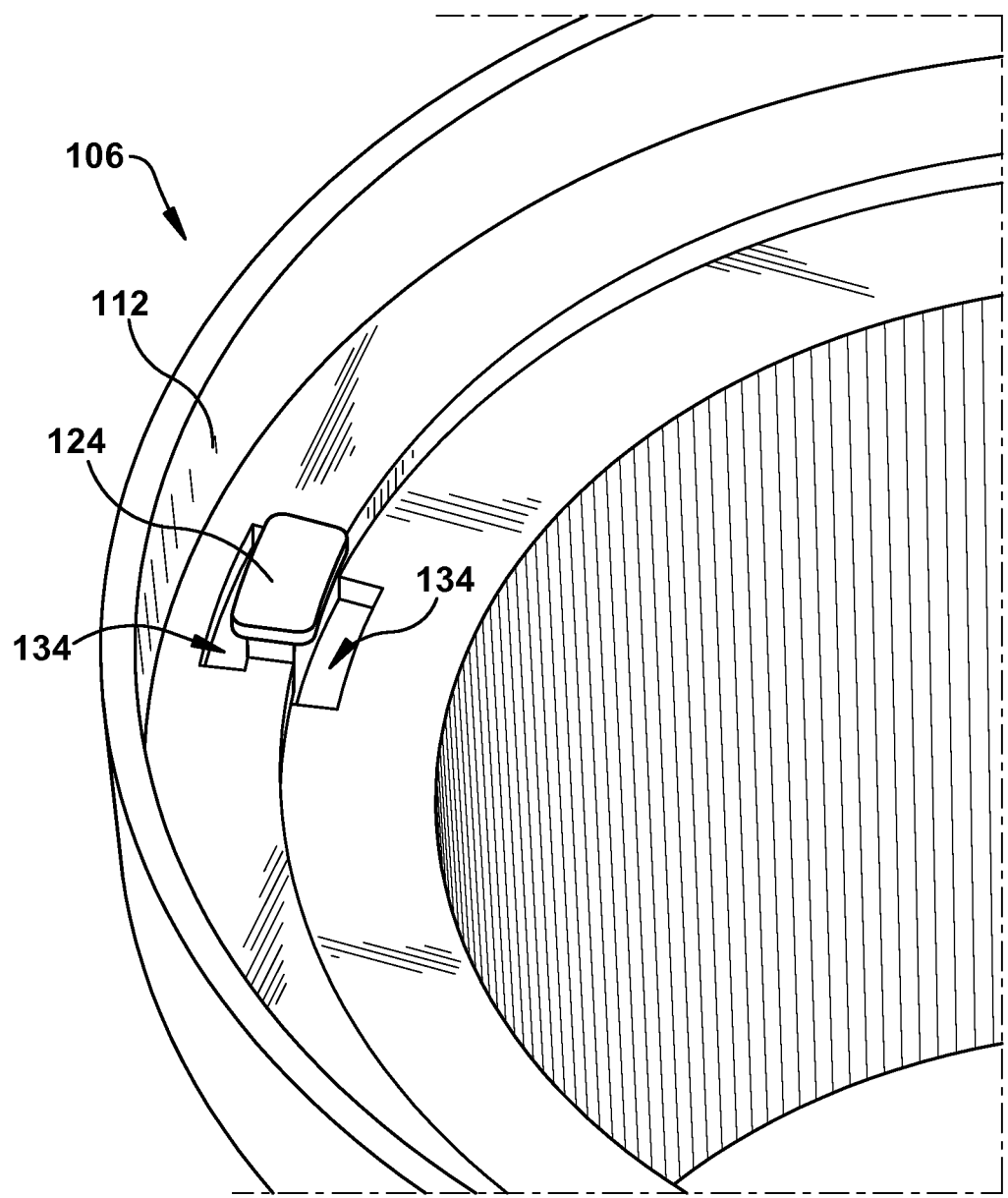
FIG. 4 shows a three-dimensional perspective view of a cover section of a utility meter according to embodiments of the invention.

FIG. 4 shows a close-up three-dimensional perspective view of the cover 106 of FIG. 1. As shown, the bi-directional tab 124 is designed to extend axially from the shroud 112 for engaging with the pair of hooks 135,136 in the base section 102 (both not shown in this depiction). Also shown in this close-up view are the apertures 134 located radially inward, and outward, respectively, of the bi-directional tab 124 in the cover 106.

In one embodiment, once the base 102 and cover are interlocked, a user can insert a mechanical element (e.g., a pin, thread, wire, etc.) through the pair of apertures 134 and a portion of the slot 126 not filled by the bi-directional tab 124. In this case, if an interested party attempts to access the utility meter components within the assembly 100, a user must either rotate the cover 106 with respect to the base 102, thus breaking the mechanical element inserted therebetween, or remove the mechanical element (which in turn will break mechanical element) and then rotate the cover 106 with respect to base 102. In either case, it will be evident that an interested party has accessed the utility meter, with or without permission, as the mechanical element, the base 102 or the cover 106 must be damaged in order to access the components on the platform 104.

It is understood that the interlocking meter shown and described according to embodiments of the invention can be modified to provide similar tamper-prevention functions. For example, the bi-directional tab(s) shown on the cover section could be included, instead, in the base section. Similarly, the slot(s) shown in the base section could be included, instead, in the cover section. Additionally, combinations of these configurations are also possible in view of aspects of the invention. It is understood that the bi-directional tab(s) shown and described herein can further be combined with other latching mechanisms known in the art, including the complementary J-shaped or L-shaped tabs of the conventional meters. Additionally, it is understood that rotation of the base relative to the cover can be prevented/detected using conventional mechanisms. For example, the base and cover may be bound by a cord, thread, pin, etc. extending therethrough, or may be bound or otherwise linked via an adhesive or tape (e.g., a tamper-indicating tape). In any case, the bi-directional tabs, and complementary hook-based interfaces shown and described according to embodiments of the invention provide greater resistance to tampering in the meters in which these designs are employed.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. It is further understood that the terms "front" and "back" are not intended to be limiting and are intended to be interchangeable where appropriate.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A utility meter cover comprising:
a window section; and
a shroud for covering a complementary portion of a meter base, the shroud including:
a radially extending base portion;
an axial extension extending from the base portion, the axial extension for obstructing access to the complementary portion of the meter base;
a key member extending axially from the base portion, the key member having a bidirectional tab for engaging a slot in the complementary portion of the meter base; and
a pair of apertures radially disposed about the key member.

2. The utility meter cover of claim 1, wherein the key member includes an axially extending base section.

3. The utility meter cover of claim 2, wherein the bidirectional tab further includes:
a first hook extending radially inward from the base section; and
a second hook extending radially outward from the base section.

4. The utility meter cover of claim 3, wherein the first hook, the second hook and the base section of the key member collectively form a T-shaped member.

5. The utility meter cover of claim 1, wherein the axial extension extends axially approximately ¼ to ⅜ inches from the base portion.

6. The utility meter cover of claim 1, wherein the key member is radially separated from, and radially inward of, the axial extension.

7. A utility meter base comprising:
a platform for mounting a plurality of meter components; and
a rim substantially surrounding the platform, the rim including:
a base portion;
a slot located within the base portion and extending substantially circumferentially about an axial center of the platform; and
a pair of opposing hooks axially extending from the base portion and overlying the slot, the pair of opposing hooks for engaging a complementary portion of a utility meter cover fitting within the slot, the pair of opposing hooks including:
a first hook extending radially outward from the axial center of the platform; and
a second hook extending radially inward toward the axial center of the platform.

8. The utility meter base of claim 7, wherein the second hook is located radially outward of the first hook along the base portion.

9. The utility meter base of claim 7, further comprising a plurality of slots located within the base portion along the rim, each slot spaced approximately 60 degrees from each adjacent slot.

10. The utility meter base of claim 7, wherein the slot located within the base portion is radially separated from, and radially inward of, the radially outer edge of the base portion.

11. A utility meter comprising:
a base section including:
a platform for mounting a plurality of meter components; and
a rim substantially surrounding the platform; and
a cover coupled to the base section, the cover including:
a window section; and
a shroud extending from the window section, the shroud including:
a radially extending base portion overlying a radially extending first face of the rim; and
an axial extension extending from the base portion and overlying an axially extending second face of the rim,
wherein either the rim or the base portion includes a key member extending axially therefrom, wherein the key member is radially separated from, and radially inward of, either the axial extension of the shroud or the second face of the rim,
the key member including:
an axially extending base section; and
a bidirectional tab for engaging a slot in a complementary portion of the other of the rim or the base portion, the bidirectional tab including:
a first hook extending radially inward from the base section; and
a second hook extending radially outward from the base section,
wherein the first hook, the second hook and the base section of the key member collectively form a T-shaped member.

12. The utility meter of claim 11, wherein the shroud further includes a pair of openings radially disposed about the key member.

13. The utility meter of claim 11, further comprising a plurality of slots located within the either of the rim or the base member, each slot spaced approximately 60 degrees from each adjacent slot.

14. The utility meter of claim 11, wherein the slot extends substantially circumferentially about an axial center of the platform.

15. The utility meter of claim 11, wherein the first hook and the second hook are radially separated from, and radially inward of, either the axial extension of the shroud or the axially extending second face of the rim, and
wherein the first hook and the second hook are axially separated from either the base portion of the shroud or the first face of the rim.

* * * * *